US006404647B1

(12) United States Patent
Minne'

(10) Patent No.: US 6,404,647 B1
(45) Date of Patent: Jun. 11, 2002

(54) SOLID-STATE MASS MEMORY STORAGE DEVICE

(75) Inventor: Mark W. Minne', Boise, ID (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/645,960

(22) Filed: Aug. 24, 2000

(51) Int. Cl.[7] ................................................. H05K 7/02
(52) U.S. Cl. ....................... 361/760; 361/737; 361/797; 361/684; 361/685
(58) Field of Search ................................. 361/760, 785, 361/797, 800, 802, 803, 820, 684, 715, 748, 736, 737, 685; 713/200, 202; 710/33

(56) References Cited

U.S. PATENT DOCUMENTS 5,061,845 A * 10/1991 Pinnavaia .................. 235/492
5,497,297 A * 3/1996 Kilmer et al. .............. 361/737
5,537,295 A * 7/1996 Van Den bout et al. .... 361/767
5,668,697 A * 9/1997 Dowdy ....................... 361/685

* cited by examiner

Primary Examiner—David Martin
Assistant Examiner—Hung Bui

(57) ABSTRACT

The present disclosure relates to a solid-state mass memory storage device which comprises a printed circuit assembly and a plurality of nonvolatile, high density storage devices mounted to the printed circuit assembly and electrically connected thereto. The solid-state memory device includes at least one controller mounted to the printed circuit assembly and electrically connected thereto, and a connector mounted to the printed circuit assembly and electrically connected thereto, the connector being adapted to electrically connect the solid-state mass memory storage device to a separate electronic device.

24 Claims, 8 Drawing Sheets

SECTION A-A

SOLID-STATE MASS MEMORY STORAGE DEVICE

FIELD OF THE INVENTION

The present disclosure relates to a solid-state mass memory storage device. More particularly, the disclosure relates to a semiconductor mass memory storage device suitable for disk drive replacement.

BACKGROUND OF THE INVENTION

As the volume of data generated by computing devices increases, the importance of memory space rises. Over the past several years, increases in demand for memory has caused a concomitant increase in the capacity of mass memory storage devices. Conventionally, these mass memory storage devices comprise rotating mass storage devices such as disk drives. Although great strides have been made in disk drive design in terms of capacity and speed, the versatility of conventional disk drives is limited. As a first matter, disk drive technology could soon reach a limit imposed by the superparamagnetic effect (SPE). As is known in the art, SPE is a physical phenomenon in which the energy that holds the magnetic spin in the atoms forming each bit becomes susceptible to ambient thermal energy and, therefore, is subject to random flipping which corrupts the data which the atoms represent. Unfortunately, the miniaturization currently popular in disk drive manufacture exacerbates the SPE problem.

A second limitation of disk drives relates to speed. Because disk drives require moving parts, the speed at which data can be stored on or accessed from the drive is limited by the speed with which the various mechanical parts of the drive can move. To increase this speed, manufacturers have continually increased the speeds at which the internal disks of the drives rotate. However, along with this increased angular velocity comes increased air turbulence and vibration which can cause misregistration of the disk tracks. In addition, to achieve high capacity and high speed, disk drives must be very precise in operation. Typically, disk drives comprise one or more disk platters and a plurality of read-write heads which record and retrieve data from circumferential tracks formed in the platters. The heads are normally moved with servomechanical actuator arms. In order to properly satisfy their record/write functions, the heads must be positioned in very close proximity to the platters, the separation between the heads and the platters typically measuring only fractions of microinches. This level of precision often results in a very fragile mechanism that can be easily damaged by moderate to large vibrations. Such susceptibility is particularly disadvantageous for portable computing devices which are often bumped and/or jolted through normal use.

In addition to fragility, disk drives further present the disadvantage of requiring relatively large amounts of power to operate. This again relates to the fact that disk drives have moving parts which require electrical power. Although not a major concern for plug-in devices such as desktop computers, this power consumption can be problematic for portable devices.

Yet another disadvantage of conventional disk drives is the physical space normally required to house the drives. Again, space constraints normally are not critical for desktop devices. However, space typically is at a premium in portable devices where smaller is often considered better. Due to such space limitations, portable devices typically do not enjoy the redundancy possible with stationary devices such as conventional network servers. As is known in the art, such stationary devices normally include a redundant array of inexpensive disks (RAID) which share the data stored in the disk drive. With this arrangement, a failure of a particular disk will not necessarily adversely effect the data stored by the drive in that the data normally can be reconstructed due to the redundancy of the data stored across the several disks. Typically, the desired level of redundancy, e.g. RAID 5 protection, requires a minimum of three disks. Due to the space limitations of portable devices such as notebook computers, however, normally only one such disk is provided. Accordingly, the desired redundancy typically cannot be provided for such devices.

From the foregoing, it can be appreciated that it would be desirable to have a high capacity, high speed, mass memory storage device which uses relatively little power, which is relatively rugged in construction, and which provides for data storage redundancy.

SUMMARY OF THE INVENTION

The present disclosure relates to a solid-state mass memory storage device. The solid-state mass memory device comprises a printed circuit assembly and a plurality of nonvolatile, high density storage devices mounted to the printed circuit assembly and electrically connected thereto. The solid-state memory device includes at least one controller mounted to the printed circuit assembly and electrically connected thereto, and a connector mounted to the printed circuit assembly and electrically connected thereto, the connector being adapted to electrically connect the solid-state mass memory storage device to a separate electronic device.

In one embodiment, the printed circuit assembly has a form factor equivalent to a conventional disk drive and the at least one controller includes control electronics and firmware which emulate a disk drive such that the device in which said solid-state mass memory storage device will interpret and treat the solid-state mass memory storage device as a disk drive. With such an arrangement, the solid-state mass memory device can be used as a disk drive replacement.

In another embodiment, the high density storage devices are removably mounted in storage device sockets formed in said printed circuit assembly in a redundant array.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
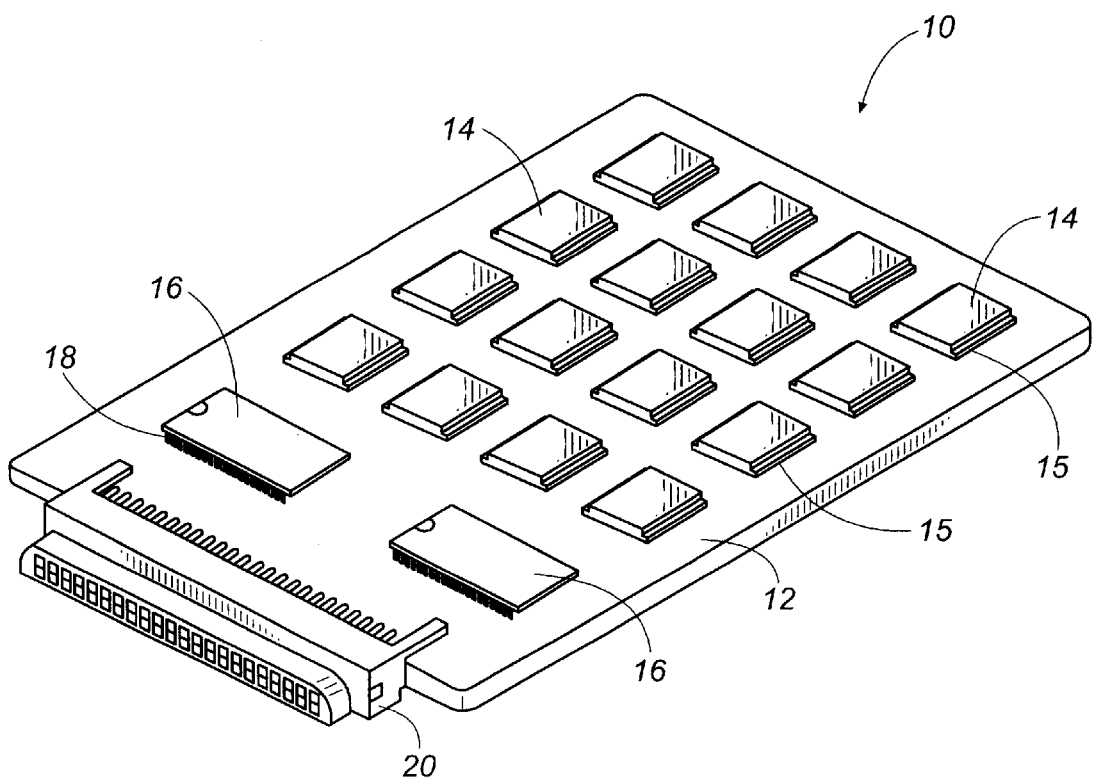
FIG. 1 is a perspective view of a mass memory storage device constructed in accordance with the principles of the present invention.

Referring now in more detail to the drawings, in which like numerals indicate corresponding parts throughout the several views, FIG. 1 illustrates a mass memory storage device 10 constructed in accordance with the principles of the present invention. As shown in this figure, the mass memory storage device 10 can generally comprise a printed circuit assembly (PCA) 12. Connected to the PCA 12 is a plurality of high density storage devices 14 which are described in greater detail below. Preferably, however, each of the high density storage devices 14 comprises a non-volatile semiconductor device which is resistant to wearout. Normally, each of the high density storage devices 14 is disposed within a storage device socket 15 formed within the PCA 12 such that each individual high density storage device 14 can be removed and replaced, if necessary. Further connected to the PCA 12 is one or more controllers 16. As illustrated in FIG. 1, each controller 16 typically comprises a semiconductor chip which can be electrically connected to the PCA with a plurality of connectors 18. By way of example, the controller 16 can comprise an integrated circuit including a read only memory (ROM) for storing control instructions, a microprocessor for executing these instructions, and a random access memory (RAM) for temporary storage of information. As will be appreciated from the description that follows, the controller 16 can also comprise other circuitry and software with which the controller 16 interfaces with the storage devices 14 and the device 10 host (e.g., personal computer) to ensure a predetermined level of storage redundancy. Also connected to the PCA 12 is a connector 20 which, as indicated in FIG. 1, can be attached to the PCA 12 at one of its ends.

Figure 2:
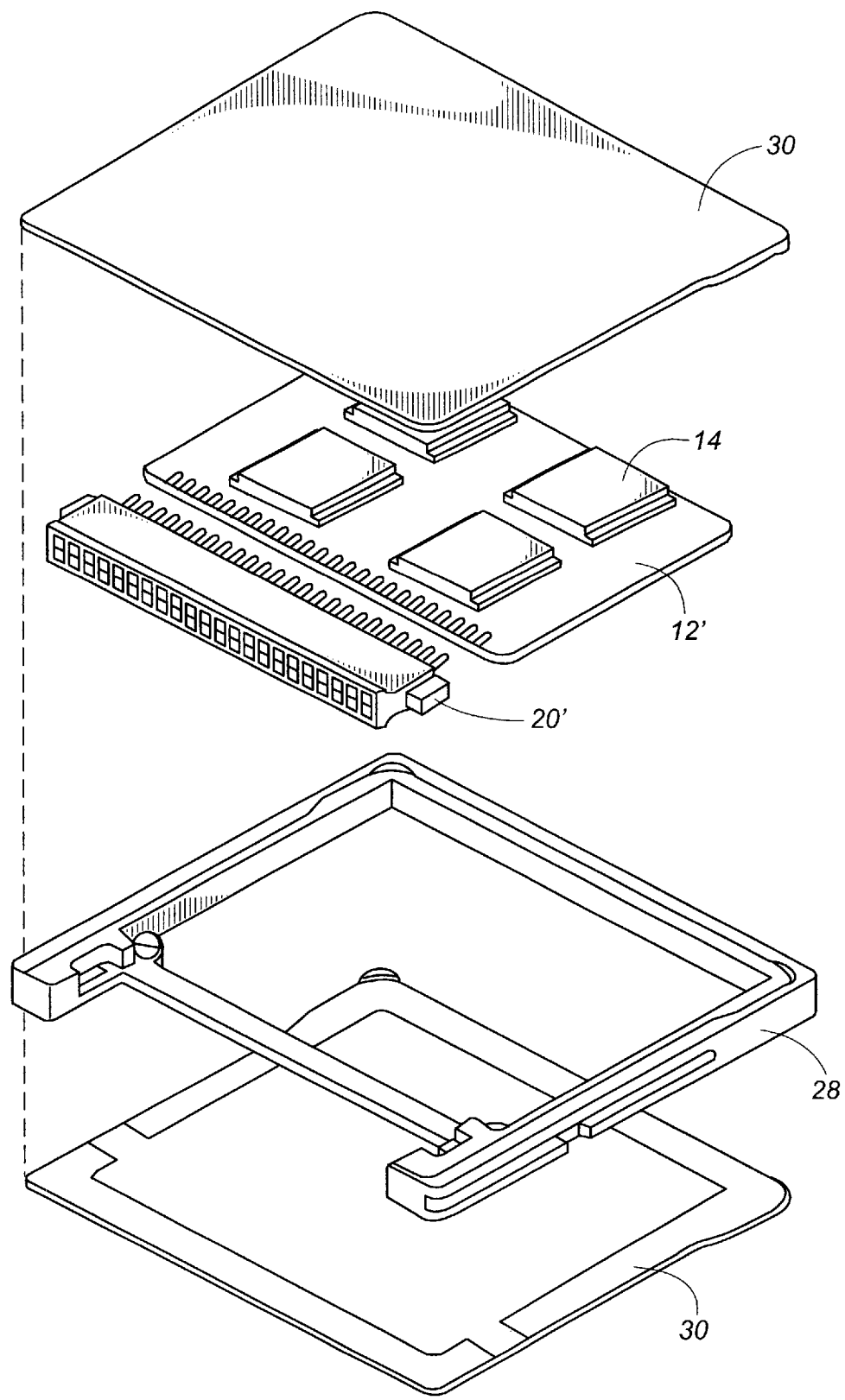
FIG. 2 is a perspective view of an alternative mass memory storage device constructed in accordance with the principles of the present invention

As identified in the foregoing, the mass memory storage device 10 is well-suited for replacing conventional disk drives in various computing devices. Accordingly, the mass memory storage device 10 typically has a form factor suitable for replacement of a disk drive such that the device 10 can be housed in the space in which the disk drive was housed previous to removal. By way of example, the mass memory storage device 10 can have a 3.5 inch, 2.5 inch, 1.8 inch, or 1.0 inch form factor. Although these particular sizes are currently considered standard and therefore desirable, it will be understood by persons having ordinary skill in the art that the mass memory storage device 10 could be sized and configured to replace substantially any disk drive. Additionally, the mass memory storage device 10 can be customized to fit in other specific applications such as handheld computing devices and mobile telephones. In such applications, the device 10 can be designed to fit in industry standard sizes (e.g., standard memory card formats as indicated in FIG. 2). FIG. 2 illustrates a mass memory storage device 10' in exploded view. As with the storage device 10, the storage device 10' includes a printed circuit assembly 12', a plurality of high density storage devices 14, and a connector 20'. Furthermore, the device comprises an internal frame 28 and outer plates 30 which enclose the device 10'.

Figure 3:
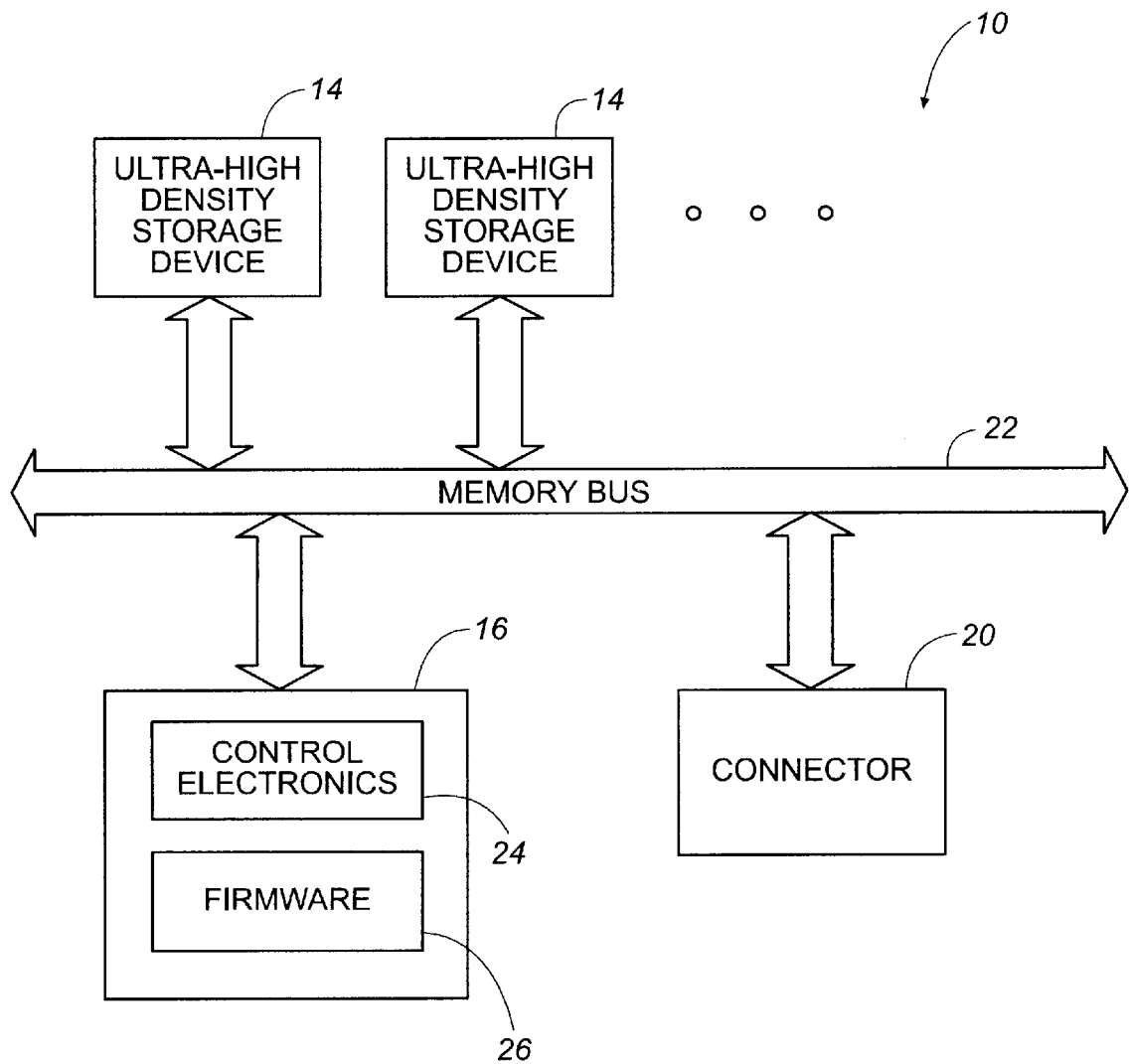
FIG. 3 is a schematic view of the architecture of the mass memory storage device shown in FIG. 1.

With reference to FIG. 3, illustrated is an example architecture of the mass memory storage device 10. As indicated in this figure, each of the high density storage devices 14 is connected to a memory bus 22 which is formed within the PCA 12 (FIG. 1). As is further indicated in FIG. 3, the controller(s) 16 can comprise control electronics 24 and firmware 26. Although the mass memory storage device 10 of the present invention is suitable for placement in new computing devices, the mass memory storage device 10 is particularly well-suited for replacement of disk drives in existing devices. To serve this end, therefore, the control electronics 24 and firmware 26 stored within the controller (s) 16 can emulate the disk drive that the storage device 10 is designed to replace such that the computing device would interpret and treat the mass memory storage device 10 as the preexisting disk drive. In such an arrangement, the computing device can be manufactured with a disk drive which can later be replaced with the mass memory storage device 10 of the present invention as an upgrade. Normally, all commands and/or data processed by the mass memory storage device 10 pass through the controller(s) 16.

Normally a plurality of high density storage devices 14 are connected to the PCA 12 in an array. With such an arrangement, the mass memory storage device 10 can provide for redundant storage of data similar to RAID protection. Accordingly, just as in RAID arrangements, a defective device, such as a single high density storage device 14, can be removed from its socket 15 and replaced with a properly functioning high density storage device 14 such that the data previously stored by the defective high density storage device 14 can be reconstructed in the conventional manner. By way of example, a high degree of redundancy is provided such as a level of redundancy equivalent to RAID 5 protection can be achieved, although it will be understood that other levels of protection can be provided. Accordingly, the mass memory storage device 10 of the present invention can be used to provide the level of storage redundancy previously available only from a plurality of disks in a limited amount of space. Therefore, such redundancy can be provided to portable computing devices such as notebook computers.

In addition to the storage redundancy available with the mass memory storage device 10, several other advantages over conventional disk drives exist. For instance, in that the mass memory storage device 10 does not comprise large moving parts, it can be used to restore and retrieve data much more quickly than with conventional disk drives. Furthermore, substantially reduced power consumption and greater resistance to physical damage is provided. Accordingly, the mass memory storage device 10 is particularly well-suited for use in portable devices which operate under battery power and which are transported from place to place. Moreover, the mass memory storage device 10 of the present invention can provide a substantially larger capacity of data storage than can conventional disk drives. As the following discussion elucidates, this increased capacity is made possible due to the high density storage devices 14.

Figure 4A:
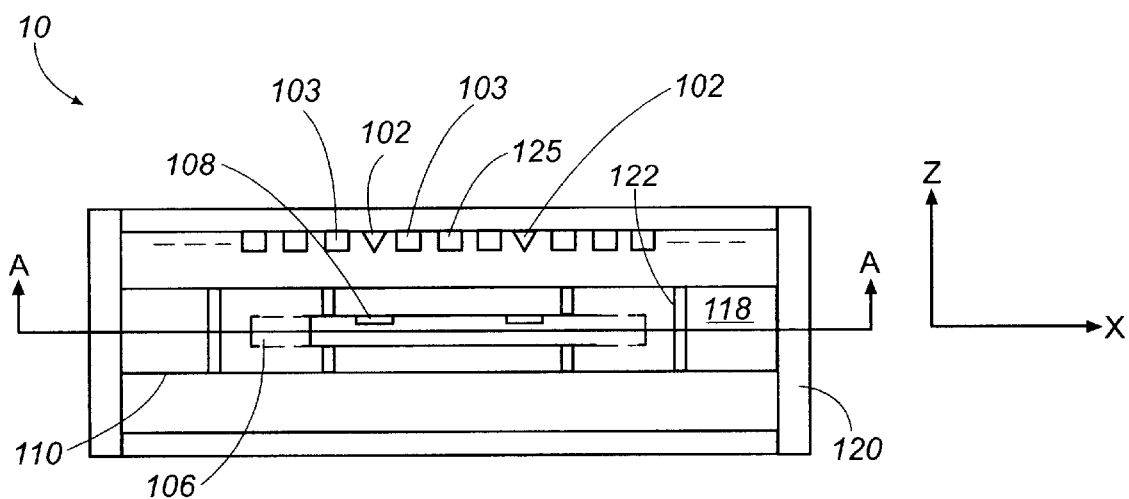
FIGS. 4A–4C are various views of an high density storage device which can be used with the mass memory storage devices shown in FIGS. 1 and 2.
Figure 4B:
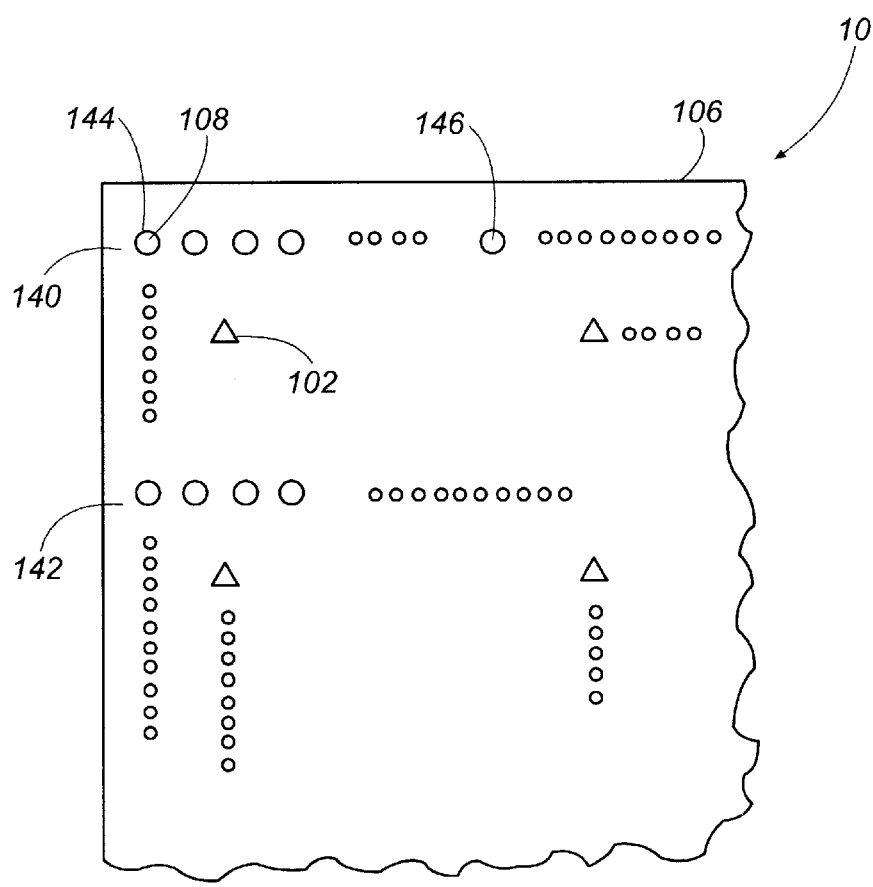
Figure 4C:
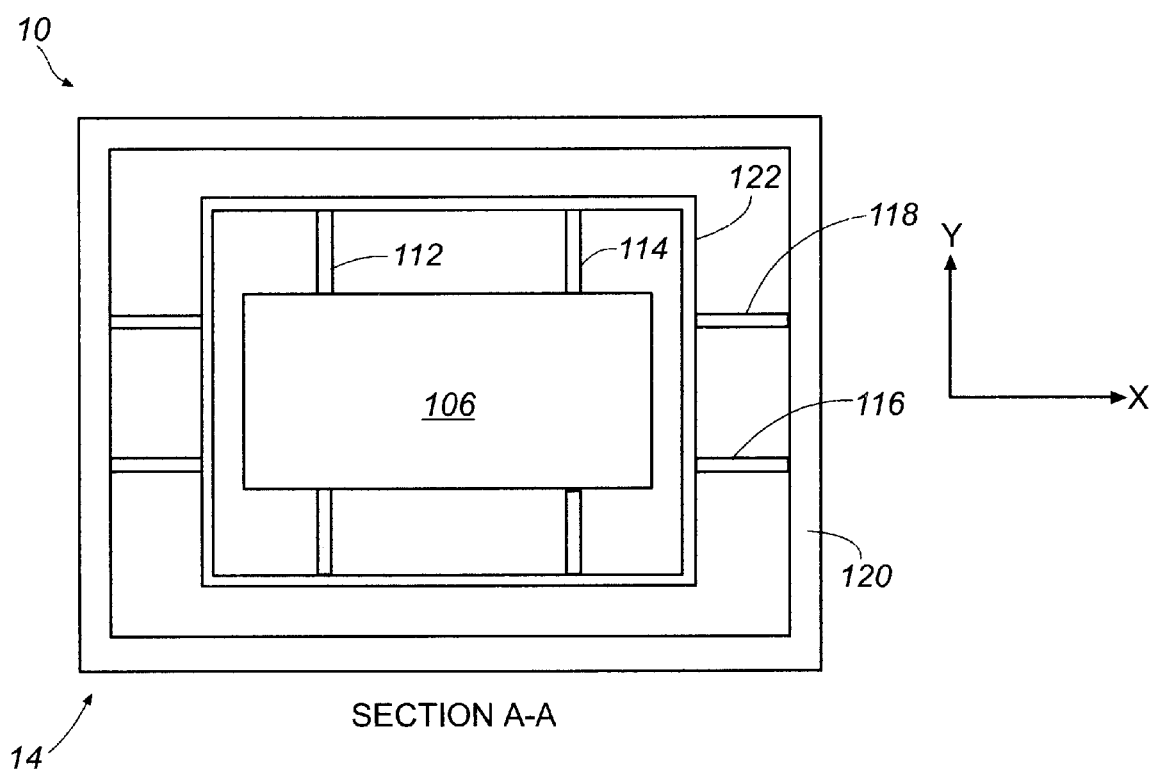
Figure 5:
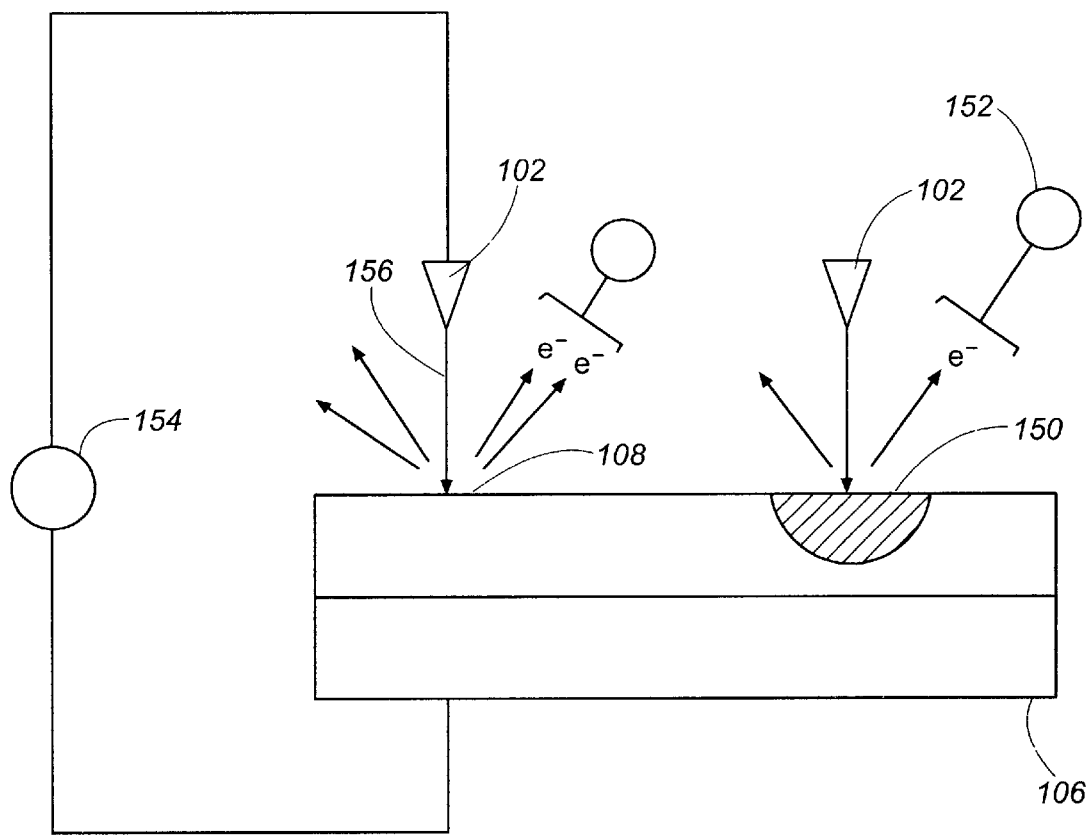
FIG. 5 is a schematic view illustrating field emitters reading from storage areas of the high density storage device shown in FIGS. 4A–4C.
Figure 6:
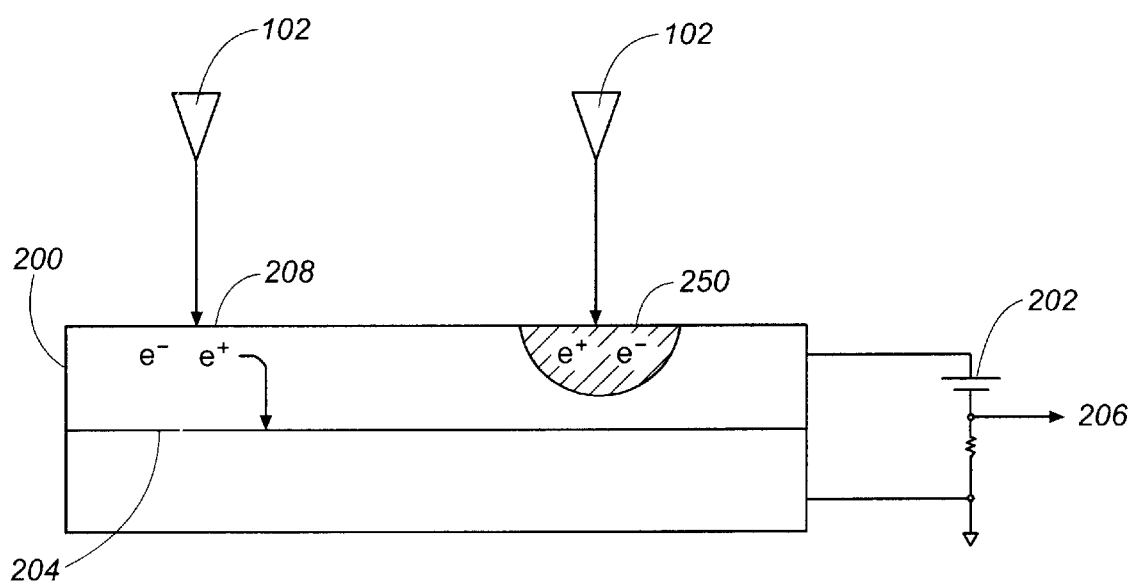
FIG. 6 is a schematic view illustrating a storage medium of the high density storage device shown in FIGS. 4–5.

FIGS. 4–6 illustrate a preferred embodiment of an high density storage device 14 suitable for implementation with the mass memory storage device 10 of the present invention which uses atomic resolution storage (ARS). The storage device 14 shown in these figures is disclosed and described in detail in U.S. Pat. No. 5,557,596, which is hereby incorporated by reference into the present disclosure. FIG. 4A shows a side cross-sectional view of one such high density storage device 14. As indicated in this figure, the storage device 14 includes a number of field emitters 102, a storage medium 106 having a number of storage areas 108, and a micromover 110 which scans the storage medium 106 with respect to the field emitters 102 or vice versa. In a preferred embodiment, each storage area 108 is responsible for storing one bit of information. Typically, the field emitters 102 are point-emitters having very sharp tips, each tip having a radius of curvature of approximately one nanometer to hundreds of nanometers. During operation, a predetermined potential difference is applied between a field emitter 102 and a corresponding gate such as a circular gate 103 which surrounds it. Due to the sharp tip of the emitter 102, an electron beam current is extracted from the emitter 102 towards the storage area 108. Depending upon the distance between the emitters 102 and the storage medium 106, the type of emitters 102, and the spot size (e.g., bit size) required, electron optics may be useful in focusing the electron beams. Voltage may also be applied to the storage medium 106 to either accelerate or decelerate the field's emitted electrons or to aid in focusing the field emitted electrons. In a preferred embodiment, a casing 120 maintains the storage medium 106 in a partial vacuum, such as at least $10^5$ torr.

In the embodiment shown in FIG. 4A, each field emitter 102 is associated with a corresponding storage area 108. As the micromover 110 scans the medium 106 to different locations, each emitter 102 is positioned above different storage areas. With the micromover 110, an array of field emitters 102 can scan over the storage medium 106. The field emitters 102 are responsible for reading and writing information on the storage areas 108 by means of the electron beams they produce. Thus, the field emitters 102 suitable for the present invention are preferably of the type that produce electron beams which are narrow enough to achieve the desired bit density of the storage medium 106, and which provide the power density of the beam current needed for reaching from and writing to the medium 106. A variety of methods are known in the art which are suitable for making such field emitters 102.

In a preferred embodiment, there can be a two-dimensional array of emitters 102, such as 100 by 100 emitters with an emitter pitch of 15 micrometers in both the X and Y directions. Each emitter 102 may access bits in tens of thousands to hundreds of millions of storage areas 108. For example, the emitters 102 can scan over the storage medium 106 (which has a two-dimensional array of storage areas 108) with a periodicity of approximately 1 to 100 manometers between any two storage areas 108 and the range of the micromover is 15 micrometers. In addition, each of the emitters 102 may be addressed simultaneously or in a multiplexed manner. Such a parallel accessing scheme significantly reduces access time and increases data rate of the storage device 14.

FIG. 4B shows a top view of the storage device 14 and illustrates a two-dimensional array of storage areas 108 and a two-dimensional array of emitters 102. To reduce the number of external circuits, the storage medium 106 can be separated into rows, such as row 140, where each row contains a number of storage areas 108 such that each emitter 102 is responsible for a number of rows. However, in such an embodiment, each emitter 102 need not be responsible for entire length of the rows. Instead, the emitter 102 can be responsible for the storage areas 108 within rows 140 through 142, and within the columns 144 through 146. All rows of storage areas accessed by one emitter 102 typically are connected to one external circuit, for example, rows 140 through 142. To address a storage area 108, the emitter 102 responsible for that storage area 108 is activated and is displaced with the micromover 110 to that storage area 108.

A preferred micromover 110 can be made in a variety of ways as long as the micromover 110 has sufficient range and resolution to position the field emitters 102 over the storage areas 108. As a conceptual example, the micromover 110 can be fabricated by a standard semiconductor microfabrication process to scan the medium 106 in the X and Y directions with respect to the casing 120.

FIG. 4C shows a top view of the cross-section A—A of FIG. 4A and illustrates the storage medium 106 being held by two sets of thin-walled microfabricated beams 112–118. The faces of the first set of thin-walled beams are in the X–Z plane, such as 112 and 114. This set of beams may be flexed in the X direction allowing the medium 106 to move in the X direction with respect to the casing 120. The faces of the second set of thin-walled beams are in the X–Z plane, such as 116 and 118. This set of beams allows the medium to move in the Y direction with respect to the casing 120. The storage medium 106 is held by the first set of beams 112, 114, which is connected to a frame 122. The frame is held by the second set of beams 116, 118, which is connected to the casing 120. The field emitters 102 scan over the storage medium 106, or the storage medium 106 scans over the field emitters 102, in the X–Y directions by electrostatic, electromagnetic, or piezoelectric means known in the art.

In use, writing is accomplished by temporarily increasing the power density of the electron beam current to modify the surface state of the storage area 108. Reading, on the other hand, is accomplished by observing the effect of the storage area 108 on the electron beams, or the effect of the electron beams on the storage area 108. Reading is typically accomplished by collecting the secondary and/or backscattered electrons when an electron beam with a lower power density is applied to the storage medium 106. During reading, the power density of the electron beam is kept low enough so that no further writing occurs. One preferred embodiment of the storage medium 106 is a material whose structural state can be changed from crystalline to an amorphous by electron beams. The amorphous state has a different SEEC and BEC than the crystalline state. This leads to a different number of secondary and backscattered electrons emitted from the storage area 108. By measuring the number of secondary and backscattered electrons, the state of the storage area 108 can be determined. To change from the amorphous to the crystalline state, the beam power density can be increased and then slowly decreased. This increase/decrease heats up the amorphous area and then slowly cools it so that the area has time to anneal into its crystalline state. To change from the crystalline to amorphous state, the beam power density is increased to a high level and then rapidly. An example of one such type of material is germanium telluride (GeTe) and ternary alloys based on GeTe.

FIG. 5 schematically illustrates the field of emitters 102 reading from the storage medium 106. In this figure, the state of one storage area 150 has been altered, while the state of another storage area 108 has not. When electrons bombard a storage area 108, both the secondary electrons and backscattered electrons will be collected by the electron collectors, such as 152. An area that has been modified will produce a different number of secondary electrons and backscattered electrons, as compared to an area that has not been modified. The difference may be greater or lesser depending upon the type of material and the type of modification made. By monitoring the magnitude of the signal current collected by the electron collectors 152, the state of and, in turn, the bit stored in the storage area can be identified.

FIG. 6 illustrates a diode approach for construction of the storage device 14. In this approach, the storage medium 106 is based on a diode structure 200, which can be a PN junction, a schottky, barrier or any other type of electronic valve. Although FIG. 6 illustrates a particular external circuit 202, it will be appreciated that this circuit is provided for purposes of example only. The basic idea is to store bits by locally altering the surface of a diode in such a way that collection efficiency for minority carriers generated by the altered region is different from that of an unaltered region. The collection efficiency for minority carriers is defined as the fraction of minority carriers generated by the instant electrons which are swept across the diode junction 204 when it is biased by an external circuit 202 to cause a signal current 206 to flow in the external circuit 202. In use, the field emitters 102 emit narrow beams of electrons onto the surface of the diode 200. The incident electrons excite electron-hole pairs near the surface of the diode 200. Because the diode 200 is reverse-biased by an external circuit 202, the minority carriers that are generated by the incident electrons are swept toward the diode junction 204. Electrons that reach the PN junction 204 are then swept across the junction 204. Accordingly, minority carriers that do not recombine with majority carriers before reaching the junction are swept across the junction, causing a current flow in the external circuit 202.

Writing onto the diode 200 is accomplished by increasing the power density of the electron beam enough to locally alter the physical properties of the diode 200. This alteration will affect the number of minority carriers swept across the junction 204 when the same area is radiated with a lower power density read electron beam. For instance, the recombination rate in a written area 250 could be increased relative to an unwritten area 108 so that the minority carriers generated in the written area 250 have an increased probability of recombining with minority carriers before they have a chance to reach and cross the junction 204. Hence, a smaller current flows in the external circuit 202 when the read electron beam is incident upon a written area 250 than when it is incident upon an unwritten area 208. Conversely, it is also possible to start with a diode structure having a high recombination rate and to write bits by locally reducing the recombination rate. The magnitude of the current resulting from the minority carriers depends upon the state of the storage area 106 and the current continues the output signal 206 to indicate the bit stored.

Figure 7:
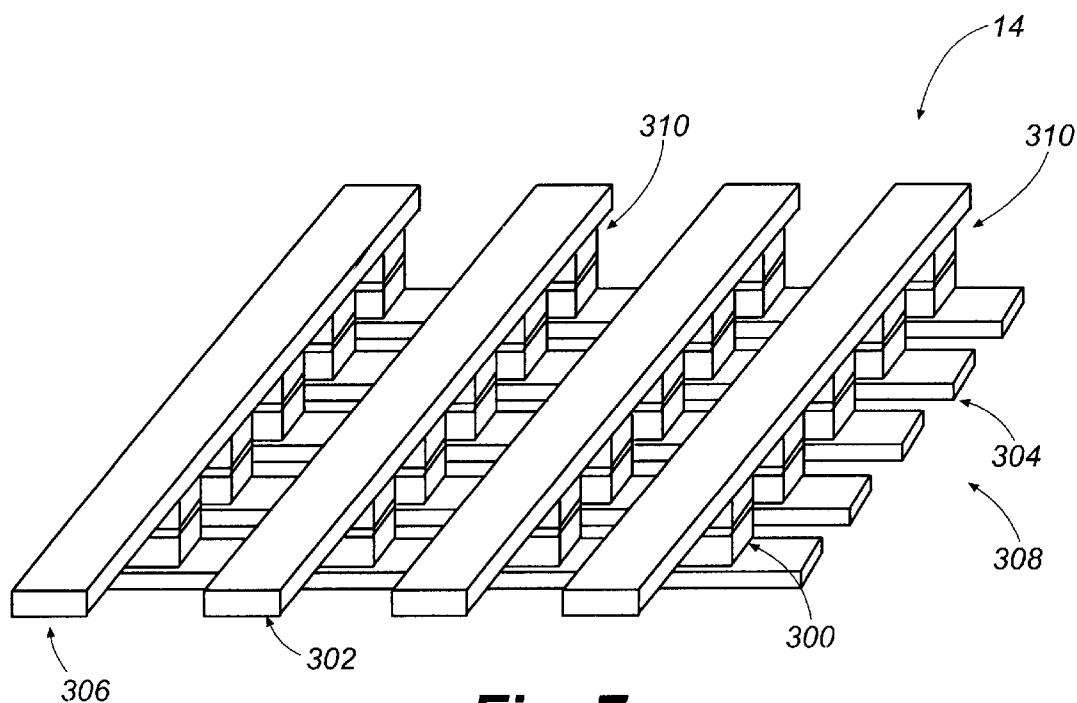
FIG. 7 is a perspective view illustrating a first alternative high density storage device which can be used with the mass memory storage devices shown in FIGS. 1 and 2.
Figure 8:
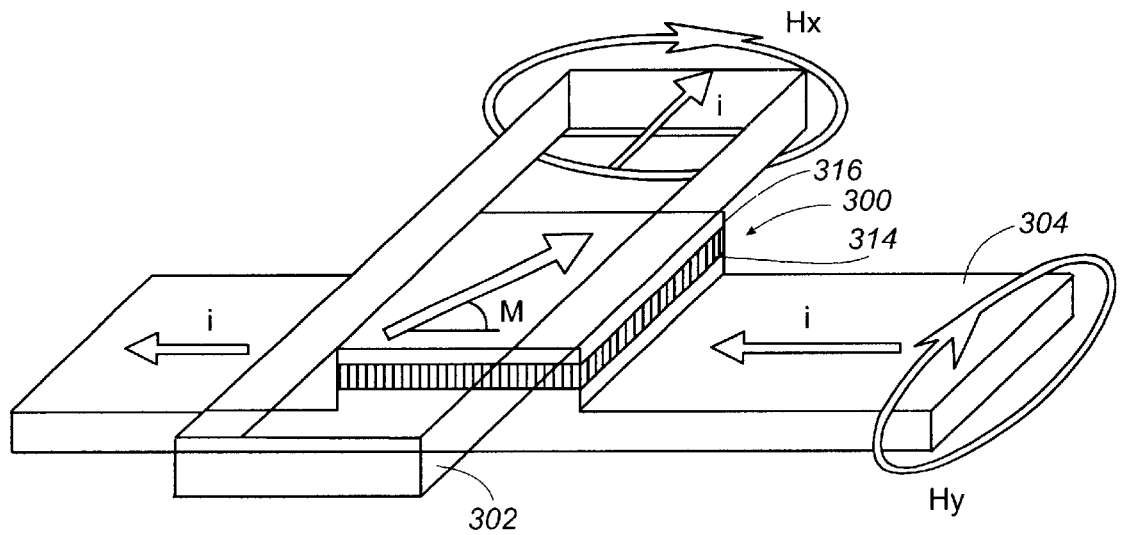
FIG. 8 is a perspective detail view illustrating the construction of the first alternative high density storage device shown in FIG. 7.

FIGS. 7 and 8 illustrate a first alternative construction of the high density storage devices 14 shown in FIG. 1. In particular, illustrated is a magnetic random access memory (MRAM) device 14'. As indicated in FIG. 7, the MRAM device 14' is a solid-state memory storage device which generally comprises a plurality of cells 300 which serve as magnetic domains and a plurality of conductor bars 302 and 304. Typically, the bars 302, 304 are arranged in first and second parallel planes 306 and 308 with the bars 302 of the first plane 306 aligned perpendicularly to the bars 304 of the second plane 308. Accordingly, the bars 302, 304 form intersection points 310. As is further indicated in FIG. 7, one cell 300 is disposed intermediate the two planes 306, 308 at each intersection point 310 formed by the bars 304, 308. Therefore, as shown in the detail view of FIG. 8, one cell 300 is sandwiched between a first bar 302 and a second bar 304 at the two bars' intersection point 306. As indicated in FIG. 8, each cell 300 comprises a pinned magnetic layer 312 (i.e., a layer which is permanently magnetized in a predetermined direction), a relatively thin dielectric layer 314, and a free magnetic sense layer 316 (i.e., a layer whose magnetization direction can be selectively changed). By way of example, the bars 302, 304 and their associated cells can be formed on one or more substrates to create an integrated device.

In use, writing is accomplished by passing current, i, through the conductor bars 302, 304 to create magnetic fields $H_x$ and $H_y$ which produce resultant vector addition magnetic forces, M, at the intersection points 310. These magnetic forces are sufficient to selectively cause the magnetic orientation of the sense layers 316 to either coincide with the magnetic direction of the pinned magnetic layer 312 or to oppose it. Detection of the written state of the sense layer's magnetism can then be accomplished by determining the differential resistance in the tunneling magneto-resistive junction between the two conductor bars 302, 304 through the sense layer 316, the dielectric layer 314, and the pinned layer 312 depending upon the pinned layer's magnetic orientation.

Figure 9:
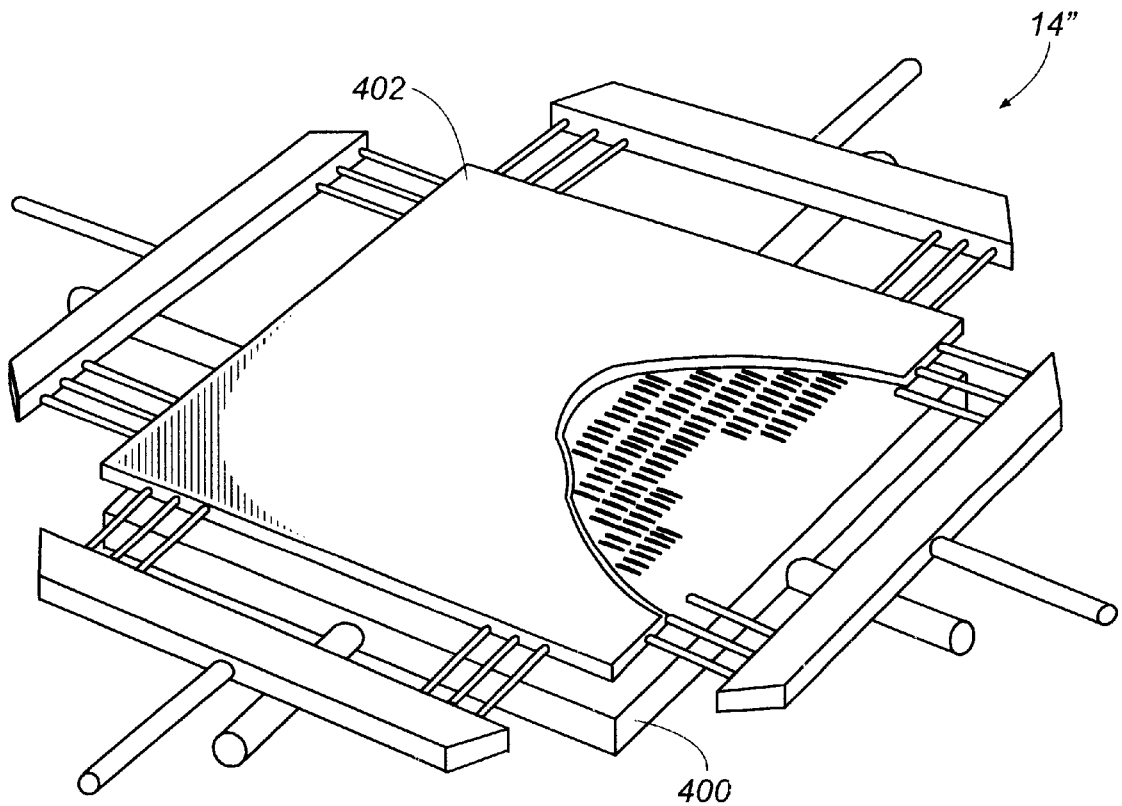
FIG. 9 is a perspective view illustrating a second alternative high density storage device which can be used with the mass memory storage devices shown in FIGS. 1 and 2.
Figure 10:
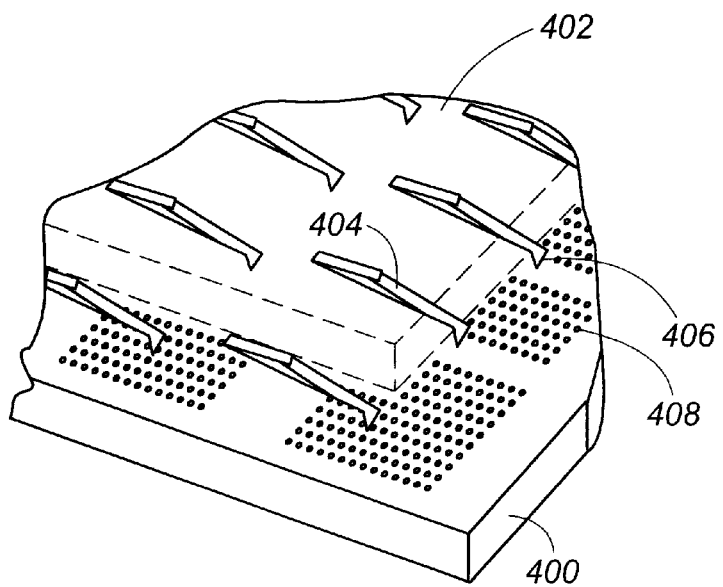
FIG. 10 is a perspective detail view illustrating the construction of the second alternative high density storage device shown in FIG. 9.

FIGS. 9 and 10 illustrate a second alternative construction of the high density storage devices 14 shown in FIG. 1. In this alternative, the storage device 14" is a stylus storage device which comprises a storage medium 400 composed of a polymeric material and a 2-D stylus array chip 402. The 2-D stylus array chip 402 comprises a plurality of styluses 404, each having a sharp tip 406 (e.g., radius of curvature of approximately 20 nm) which rests upon the smooth surface of the storage medium. In use, writing is accomplished by passing a current through the stylus 404 to briefly heat the tip 406 to a high temperature (e.g., 400° C.). The heated tip 406 causes the surface of the medium 400 to melt, forming an indentation 408. When a series of indentations 408 are formed, the dips and flats can be treated as 0's and 1's. To read this information, the stylus tip 406 is heated to a temperature below the melting point of the polymeric material (e.g., 350° C.). When the stylus 404 drops into an indentation 408 formed in the medium 400, the heat from the tip 406 of the stylus 404 dissipates. This temperature drop can then be detected by monitoring the electrical resistance of the stylus 404.

Although specific embodiments of the high density storage devices 14 have been provided herein, it will be appreciated that these embodiments are provided by way of example only. Most preferably, however, the storage device 14 used will have high capacity, be nonvolitile, and resistant to read/write wearout. Irrespective of the particular form of the high density storage device 14 used, several advantages can be obtained through use of the mass memory storage device 10 described herein. First, the storage device described in this disclosure is less susceptible to SPE as compared to conventional disk drives. Second, the storage device can read and write with greater speed than conventional disk drives in that the moving parts of the device are of such low mass. Furthermore, because of this low mass, the presently disclosed storage device normally is more robust than conventional disk drives and typically requires less power to operate. Moreover, the herein described storage device usually can be manufactured smaller than conventional disk drives and therefore a desirable amount of storage redundancy can be obtained, even where space is limited.

While particular embodiments of the invention have been disclosed in detail in the foregoing description and drawings for purposes of example, it will be understood by those skilled in the art that variations and modifications thereof can be made without departing from the spirit and scope of the invention as set forth in the following claims.

What is claimed is:

1. A solid-state mass memory storage device, comprising:

a printed circuit assembly;

a plurality of nonvolatile, high density storage devices mounted to said printed circuit assembly and electrically connected thereto;

at least one controller mounted to said printed circuit assembly and electrically connected thereto; and a connector mounted to said printed circuit assembly and electrically connected thereto, said connector being adapted to electrically connect said solid-state mass memory storage device to a separate electronic device;

wherein said mass memory storage device has a form factor equivalent to that of a conventional disk drive such that said storage device is configured for replacing a disk drive of a computing device.

2. The device of claim 1, wherein said printed circuit assembly has a form factor equivalent to an industry standard memory card.

3. The device of claim 1, wherein each of said high density storage devices is mounted in a storage device socket formed in said printed circuit assembly.

4. The device of claim 3, wherein said high density storage devices are selectively removable from said storage device sockets.

5. The device of claim 1, wherein said high density storage devices are electrically connected in a redundant array such that said high density storage devices redundantly store information.

6. The device of claim 5, wherein said array is arranged so as to provide a level of redundancy equivalent to RAID 5 protection.

7. The device of claim 1, wherein said at least one controller includes control electronics and firmware which emulate a disk drive such that the device in which said solid-state mass memory storage device is used will interpret and treat said solid-state mass memory storage device as a disk drive.

8. The device of claim 1, wherein said high density storage device is an atomic resolution storage device.

9. The device of claim 1, wherein said high density storage device is a magnetic random access memory device.

10. The device of claim 1, wherein said high density storage device is a stylus storage device.

11. The device of claim 1, wherein said mass memory storage device has a form factor equivalent to at least one of a 3.5 inch disk drive, a 2.5 inch disk drive, a 1.8 inch disk drive, and a 1.0 inch disk drive.

12. A solid-state mass memory storage device for disk drive replacement, comprising:

a printed circuit assembly having a form factor equivalent to a conventional disk drive and being provided with a plurality of storage device sockets;

a plurality of nonvolatile, high density storage devices removably mounted to said printed circuit assembly and electrically connected thereto via said storage device sockets;

at least one controller mounted to said printed circuit assembly and electrically connected thereto; and a connector mounted to said printed circuit assembly and electrically connected thereto, said connector being adapted to electrically connect said solid-state mass memory storage device to a separate electronic device.

13. The device of claim 12, wherein said high density storage devices are electrically connected in a redundant array such that said high density storage devices redundantly store information.

14. The device of claim 12, wherein said array is arranged so as to provide a level of redundancy equivalent to RAID 5 protection.

15. The device of claim 12, wherein said at least one controller includes control electronics and firmware which emulate a disk drive such that the device in which said solid-state mass memory storage device is used will interpret and treat said solid-state mass memory storage device as a disk drive.

16. The device of claim 12, wherein said high density storage device is an atomic resolution storage device.

17. The device of claim 12, wherein said high density storage device is a magnetic random access memory device.

18. The device of claim 12, wherein said high density storage device is a stylus storage device.

19. A method of constructing a disk drive replacement storage device, comprising:

forming a printed circuit assembly having a form factor equivalent to a conventional disk drive and a plurality of storage device sockets which are electrically connected to each other;

mounting a plurality of high density storage devices to the storage device sockets of the printed circuit assembly; and mounting at least one controller to the printed circuit assembly, the at least one controller having control electronics and firmware which emulate a disk drive such that the device in which the disk drive replacement storage device is used will interpret and treat the disk drive replacement storage device as a disk drive.

20. The method claim 19, further comprising electrically connecting the high density storage devices in a redundant array such that the high density storage devices redundantly store information.

21. The method of claim 20, wherein the array is arranged so as to provide a level of redundancy equivalent to RAID 5 protection.

22. The method of claim 19, wherein said high density storage device is an atomic resolution storage device.

23. The method of claim 19, wherein said high density storage device is a magnetic random access memory device.

24. The method of claim 19, wherein said high density storage device is stylus storage device.

\* \* \* \* \*